United States Patent [19]
Dean et al.

[11] Patent Number: 5,643,838
[45] Date of Patent: Jul. 1, 1997

[54] LOW TEMPERATURE DEPOSITION OF SILICON OXIDES FOR DEVICE FABRICATION

[75] Inventors: Robert Earl Dean, High Bridge; Pang-Dow Foo, Berkeley Heights; Earl Ryan Lory, Pennington; Leonard Jay Olmer, Hopewell, all of N.J.

[73] Assignee: Lucent Technologies Inc., Murray Hill, N.J.

[21] Appl. No.: 116,309

[22] Filed: Sep. 3, 1993

Related U.S. Application Data

[63] Continuation of Ser. No. 798,355, Nov. 21, 1991, abandoned, which is a continuation of Ser. No. 632,636, Dec. 26, 1990, abandoned, which is a continuation of Ser. No. 175,567, Mar. 31, 1988, abandoned.

[51] Int. Cl.$^6$ .................................................. H01L 21/02
[52] U.S. Cl. ........................... 437/238; 437/235; 427/574; 427/579
[58] Field of Search ........................... 437/235, 238; 427/574, 578, 579

[56] References Cited

U.S. PATENT DOCUMENTS

| | | | |
|---|---|---|---|
| 3,655,438 | 4/1972 | Sterling | 437/39 |
| 4,365,405 | 12/1982 | Dickman et al. | 437/52 |
| 4,597,985 | 7/1986 | Chandross et al. | 427/39 |
| 4,702,936 | 10/1987 | Maeda | 437/241 |
| 4,872,947 | 10/1989 | Wang et al. | 437/238 |
| 4,892,753 | 1/1990 | Wang et al. | 427/38 |
| 4,962,063 | 10/1990 | Maydan et al. | 437/235 |
| 5,000,113 | 3/1991 | Wang et al. | 118/723 |
| 5,013,691 | 5/1991 | Lory et al. | 437/238 |
| 5,040,046 | 8/1991 | Chhabra et al. | 437/241 |
| 5,300,460 | 4/1994 | Collins et al. | 437/225 |
| 5,302,555 | 4/1994 | Yu | 437/235 |
| 5,354,715 | 10/1994 | Wang et al. | 437/235 |
| 5,362,526 | 11/1994 | Wang et al. | 427/573 |

OTHER PUBLICATIONS

Osipov, Precipat. of films from low temp. TEOS plasma, Chem. Abstracts, 1970, vol. 73:69397.

Wolf, Silicon Processing for the VLSI Era, vol. 1, 1986, pp. 167–175.

Extended Abstract by L.J. Olmer, et al, entitled "Intermetal Dielectric Deposition by Plasma Enhanced CVD", for talk presented at the Spring Meeting of the Electrochemical Society, May 10–15, 1987.

Paper by L.J. Olmer, et al, entitled "Intermetal Dielectric Deposition by Plasma Enhanced CVD", resulting from talk presented at the Spring Meeting of the Electrochemical Society, May 10–15, 1987.

Ivanov, M. Ya, Chemical Abstracts, 1985, vol. 102: 134316r, Model. of The plasmochem. Syn. of Sil. Dioxide.

Bekeris, J., Charge properties of Sil. Dioxide films, Chemical Abstracts, 1985, vol. 102: 196025d.

Osipov, K.A., Precipat. of films frow low-Temp TEOS plasma, Chemical Abstracts, 1970, vol. 73:69397.

Silicon Processing for the VLSI Era, vol. 1, 1986 Lattice Press, CA, S. Wolf, pp. 167–175.

Ivanov, M., Chemical Abstracts, 1985, vol. 102: 134316r, Model of plasmochem. syn. of silicon dioxide.

Bekenis, J., Charge properties of sil. dioxide films, Chemical Abstracts, 1985, vol. 102: 196025d.

Osipov, K., Precipat. of films from low-temp. TEOS plasma, Chemical Abstracts, 1970, vol. 73: 69397j.

Wolf, S., Silicon Processing for the VLSI Era, vol. 1, 1986, Lattice Press, pp. 167–175.

(List continued on next page.)

*Primary Examiner*—Nam Nguyen
*Attorney, Agent, or Firm*—Bruce S. Schneider

[57] ABSTRACT

The use of a deposition process involving a plasma struck in a gas including tetraethoxysilane and a source of oxygen yields, at low temperatures, conformal coatings of silicon dioxide. This process has significant implications for semiconductor device fabrication involving the deposition of a dielectric over a metallic non-planar structure.

11 Claims, 9 Drawing Sheets

OTHER PUBLICATIONS

A.K. Sinha, Proceedings of the First International Symposium on VLSI and Technology, 1982, Electrochemical Society, p. 173.

VLSI Technology, S. M. Sze, 1983, McGraw-Hill, New York, Chapter 3.

K.I. Kibov, et al, *Phys. Stat. Sol.*, (a) 48, pp. 609–614 (1978).

J. Woodward, et al, *Thin Solid Films*, 85, pp. 61–69 (1981).

E.B. Priestley, et al, *Thin Solid Films*, 69, pp. 39–52 (1980).

D.R. Secrist, et al, *Journal of the Electrochemical Society*, 113, pp. 914–920 (Sep. 1966).

S.W. Ing, et al, *Journal of the Electrochemical Society*, 112, pp. 284–288 (Mar. 1965).

S.P. Mukherjee, et al, *Thin Solid Films*, 14, pp. 105–118 (1972).

U. Mackens, et al, *Thin Solid Films*, 97, pp. 53–61 (1982).

G.S. Mathad, G.C. Schwartz, and R.A. Gottscho, editors, *Proceedings of the Sixth Symposium on Plasma Processing*, 87–6, "Plasma —Assisted Deposition of Dielectric Films" by A.C. Adams, pp. 375–395.

J. Mort and F. Jansen, editors, *Plasma Deposited Thin Films*, "Silicon Nitride and Other Insulator Films" by A.C. Adams, pp. 129–159, CRC Press, Inc. (1986).

A.C. Adams, et al, *Journal of the Electrochemical Society*, 128, pp. 1543–1551 (Jul. 1981).

R. Reif and G.R. Srinivasan, editors, *Proceedings of the Symposium on Reduced Temperature Processing for VLSI*, 86–5, "Plasma —Assisted Deposition of Dielectric Films" (and viewgraphs) by A.C. Adams, The Electrochemical Society.

J.R. Hollahan and A.T. Bell, editors,*Techniques and Applications of Plasma Chemistry*, pp. 366–367, John Wiley & Sons (1974).

Viewgraphs from lecture given at the American Society of Metallurgics Meeting (1986) entitled "Plasma–Assisted Deposition of Dielectric Films" by A.C. Adams.

Applied v. Novellus Deposition: Ashok Sinha Applied Highly Sensitive Attys. Only May 21, 1996, pp. 13, 16, 53, 54, 55, 56, 85, 86, 87, 88, 109, 110, 111, 112, 125, 126, 127, 128, 129, 130, 131, 132, 133–148.

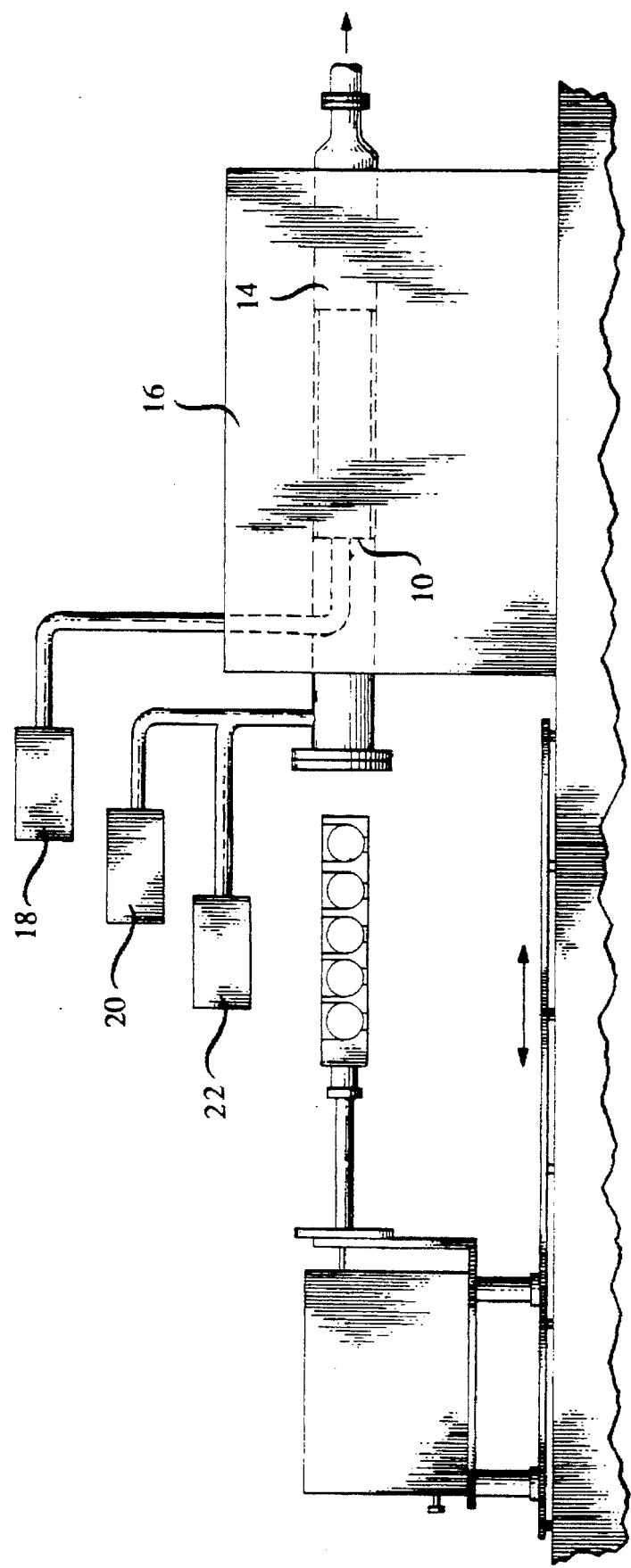

STEP COVERAGE vs FREQUENCY 7.3 MHz 13.3 MHz

STEP COVERAGE vs FREQUENCY

LOW TEMPERATURE DEPOSITION OF SILICON OXIDES FOR DEVICE FABRICATION

This application is a continuation of application Ser. No. 07/798,355 filed on Nov. 21, 1991, now abandoned which is a continuation of application Ser. No. 07/632,636 filed Dec. 26, 1990 now abandoned, which is a continuation of application Ser. No. 07/175,567 filed Mar. 31, 1988 now abandoned.

BACKGROUND OF THE INVENTION

1. Technical Field

This invention relates to the fabrication of devices and, in particular, the fabrication of devices that include a silicon oxide region.

2. Art Background

In the fabrication of devices such as semiconductor devices, a variety of material layers is sequentially formed and processed on a substrate. (For the purpose of this disclosure, the substrate includes a bulk material such as (1) a pyroelectric, e.g., $LiNbO_3$, or (2) a semiconductor, e.g., silicon, body, and if present, various regions of materials such as dielectric materials, metallic materials, and/or semicondutor materials.) Often, one of the material regions utilized in this fabrication procedure includes a silicon oxide, i.e., a material nominally represented by the formula $SiO_n$ where $0<n\leq 2$. For example, silicon oxide regions are utilized as passivating layers as electrical insulation between conducting layers, e.g., metal layers, and as a cap for doped semiconductor layers to limit unacceptable dopant migration during subsequent processing.

A silicon oxide is often deposited on a non-planar substrate surface having a plurality of steps, e.g., metal steps, (6 in FIG. 1). It is desirable that the deposited silicon conformally coat this non-planar surface. If a conformal silicon oxide layer is not achieved, an irregular coating, 18, forms over the underlying steps, 12. If deposition is continued, voids, 10, as shown in FIG. 2, are often produced. An irregular coating such as shown in FIG. 1 is, in many situations, unacceptable because a non-planar surface degrades the resolution of subsequent photolithography. Voids such as shown in FIG. 2 are even less desirable because etching and dielectric properties will be nonuniform. In either case, lack of planarity generally produces difficulties in subsequent processing. Therefore, it is very desirable to produce a conformal coating. (Conformance is measured by two ratios, i.e., (1) the ratio between dimensions s (FIG. 3) and dimension t and (2) the ratio between dimension b and dimension t.)

Although silicon oxide conformal coatings are very difficult to produce, one process, generally denominated the TEOS (tetraethoxysilane) process, leads to a silicon oxide region having ratios of approximately 0.9 for 1.0 μm-dimension steps. This process involves flowing tetraethoxysilane over a heated deposition substrate and thus causing pyrolysis of the compound with the resulting formation of silicon oxide. The decomposition of the tetraethoxysilane must be performed at temperatures of approximately 700 degrees Centigrade or higher to achieve an acceptable silicon oxide deposition rate, i.e., g rate greater than 10 Angstroms/min. (Phosphorus oxide doping of silicon oxide formed from TEOS allows deposition at temperatures down to 650 degrees Centigrade.) However, device structures, e.g., $LiNbO_3$/silicon interfaces, doped silicon regions, and aluminum/silicon interfaces, which cannot tolerate nominal exposure to temperatures above 500 degrees Centigrade are common, and this sensitivity severely limits the usefulness of the TEOS process.

Lower temperature processes for depositing silicon oxides are available. Exemplary of such processes is the reaction of silane and oxygen at about 400 degrees Centigrade or silane and nitrous oxide at about 600 degrees Centigrade. The resulting silicon oxide of the silane/oxygen reaction contains particulate matter and is extremely nonconformal, exhibiting ratios less than 0.5. Similarly, the material resulting from silane/nitrous oxide reactions are also nonconformal. In either case, not only are nonconformal surfaces present, but nonuniform etching and electrical properties are often obtained.

A different approach to producing a low-temperature dielectric has involved the use of organic materials such as imide polymers. Nevertheless, an imide layer alone has been found to be unacceptable because of possible contamination of the underlying device regions. To alleviate this problem, a thin layer of quartz has generally been sputtered onto the substrate before formation of the imide region. Although contamination is precluded, this sputtering procedure is extremely slow, and as a result, is not particularly desirable. Thus, approaches involving the use of organic layers also have significant shortcomings.

SUMMARY OF THE INVENTION

It has been found that stable, relatively conformal dielectric layers over metal structures, e.g., structures formed by aluminum or tungsten, or alloys of these materials, are producible utilizing a relatively rapid plasma deposition process. In particular, this plasma deposition process involves the introduction of tetraethoxysilane (TEOS) and a source of oxygen into a plasma. The resulting plasma reaction produces a conformal coating over features having a height as high as 1 μm and an aspect ratio as large as 2. (Aspect ratio is defined as the height of the features divided by the space between adjacent features.) To produce this desired result, TEOS alone is not useful but must be introduced into the plasma in the presence of a source of oxygen, e.g., $O_2$, $NO_2$, $CO_2$ and/or $N_2O$.

BRIEF DESCRIPTION OF THE DRAWINGS

FIGS. 4 and 5 are illustrative of equipment useful in the invention, and

DETAILED DESCRIPTION

Figure 1:
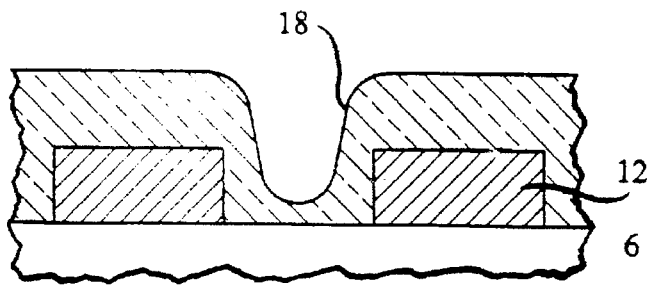
FIGS. 1 through 3 are illustrative of configurations relating to the invention.
Figure 2:
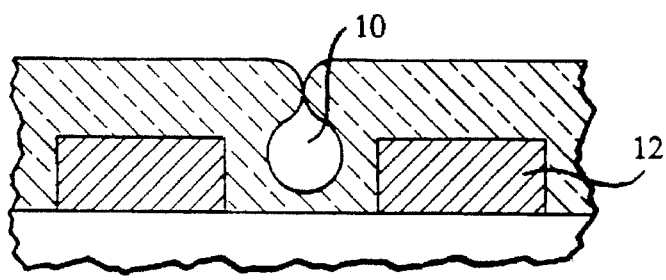
Figure 3:
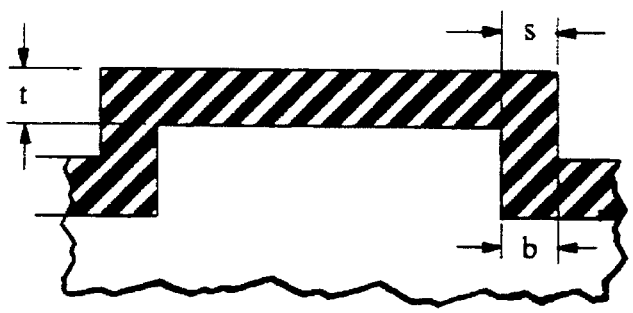

An apparatus suitable for performing the invention is shown in FIG. 4. Basically, the apparatus includes a source of energy for producing a plasma, e.g., a radio frequency source, a grounded electrode, a powered electrode, and a means for introducing and removing gas from the electrode region. The parameters involved in choosing these components affect the properties of the materials being produced.

Typically, the electrodes are made from materials such as aluminum. The shape of the electrode is not critical, however, generally a rectangular shape is conveniently produced, and thus, is often employed. The electrodes are conveniently positioned with their major surfaces parallel to promote a uniform electric field, a resulting uniform plasma, and in turn, a uniform film. The gap between the powered and unpowered electrode affects the reaction sequence. The results for a particular gap also depend on the reactant flow, gas pressure, and precise electrode geometry. If the gap is too large for the conditions employed, gas phase reaction occurs producing powder in the gas phase, and thus, introducing unwanted particulates onto the substrate being processed. A control sample is easily used to determine a suitable gap. However, typically, gaps measured in a direction perpendicular to the electrode major surface in the range one inch to one-eighth inch are employed.

The frequency of the radiation and the deposition temperature utilized to produce the plasma affects the properties of the deposited silicon dioxide. In general, lower temperatures, i.e., temperatures below 300 degrees Centigrade generally produce less dense materials which contain silanol groups. At higher frequencies, i.e., frequencies greater than 1 MHz the tendency is for the deposited oxide to crack when deposited in thicknesses greater than about 1.3 microns. Similarly, the dielectric constant is a function of plasma frequency and temperature. The dielectric constant is higher for low temperatures and/or higher plasma frequencies (i.e., at 13.56 MHz, 400° C. Eo=5.2 and at 100 kHz, 350° C. Eo=3.8).

The frequency utilized should be chosen for the particular application. Applications requiring thicker films and/or lower dielectric constant are better satisfied utilizing low frequency. Applications requiring the best obtainable step coverage are better satisfied utilizing high frequency.

As previously discussed, cracking at thicknesses greater than 1.3 μm is often encountered for high frequency. This cracking is substantially mitigated by adding nitrogen-containing materials such as $NH_3$ to the plasma discharge and/or adding materials such as trimethylphosphite to the discharge that produces doping of the deposited silicon oxide.

As previously discussed, the discharge is produced in a gas-containing TEOS and a source of oxygen. Generally, TEOS is employed as 5 to 30 mole percent with the balance being the oxygen-containing compound to produce desirable material deposition. Typically, total pressures in the range 0.1 to 2 Torr are employed. It is also possible to add an inert gas such as Ar or He. It is possible to add various gases to the plasma to influence properties of the deposited silicon oxide. For example, $NH_3$ or dopant are added advantageously to a high frequency discharge to prevent cracking in thicker deposited layers. Typically, the mole percent of these materials is 2 to 6 percent.

The conformal silicon dioxide is typically deposited over a metal structure such as onto an aluminum or tungsten structure. (Metal structures that are formed from alloys or from multiple layers such as an aluminum layer overlaid by a titanium layer are also considered a metal layer.) It is possible to obtain conformal coatings having conformal ratios greater than 0.9 for feature heights up to 1 μm as measured by scanning electron microscopy and for aspect ratios up to 2.

The following examples are illustrative of conditions useful in the invention:

EXAMPLE 1

A two-level CMOS device was produced. This device was formed by initially utilizing a substrate having a standard CMOS configuration and a metal aluminum conductive pattern as described by A. K. Sinha in *Proceedings of the First International Symposium on VLSI Science and Technology*, ed. by the Electrochemical Society, 1982, p. 173.

A parallel plate plasma deposition apparatus was employed. This apparatus included two 7-inch by 7-inch electrodes spaced a half-inch apart with parallel major planes. The upper electrode was powered with an rf frequency radiation of 100 kHz. The bottom electrode which held the sample was both dc and ac grounded. An expedient for resistively heating the wafer on the bottom electrode was provided. Provision for introducing a gas flow was made so that the direction of the gas flow was parallel to the major surfaces of the electrodes. This gas flow was introduced on one side of the wafer through a manifold and a suitable outlet for the effluent was supplied on the opposite side of the electrodes. The manifold was approximately 7 inches long with 12 equally spaced holes. The manifold was positioned so that the holes directed a flow in the desired gas flow direction. The manifold was also positioned relatively close to the heated electrode so that it also was heated to an elevated temperature. Both an oxygen gas flow and a TEOS liquid flow was introduced into the manifold and because of this heating emerged as a combined gas. A roughing pump and blower were supplied to evacuate the deposition chamber to base pressures of approximately 5 micrometers. A capacitance monomer was supplied to monitor the pressure in the chamber and this monitor was interconnected with the feedback mechanism to allow maintenance of a desired pressure. The chamber was a cold wall system and thus had no provision for baking of the walls.

The grounded electrode was heated to approximately 330 degrees Centigrade. The sample was then placed on the electrode and the chamber evacuated. The oxygen gas flow and the liquid TEOS flow was then initiated. The oxygen was introduced at a rate of approximately 150 sccm and the liquid TEOS was pumped into the manifold in the form of droplets at a liquid flow rate of 0.2 milliliters per minute. A throttle valve on the vacuum pump was then adjusted to yield a total pressure of approximately 0.6 Torr (80 Pascal). A power of 12 watts at a frequency of 100 kHz was applied to the upper electrodes. A 600 ohm matching network was employed so that the application of power initiated the plasma. The plasma deposition was allowed to continue for 40 minutes. The deposition rate was approximately 500 Angstroms a minute so that a total deposition of approximately 2 micrometers was obtained. The plasma was then extinguished, the gas flows terminated, and the chamber evacuated to base pressure. The chamber was backfilled with dry nitrogen and the sample was removed.

The resulting film had a refractive index of approximately 1.44, had a step coverage (the ratio of deposition thickness on horizontal surfaces to that on vertical surfaces) of between 70 and 75 percent for features having an aspect ratio of 0.45, and the IR spectra exhibited a Si—O stretch as 1075 (as compared to 1090 for thermal oxide) with no evidence of water or silanol groups. The deposited layer was etched at a rate of 425 Angstroms per minute in an aqueous HF etchant (30:1) buffered with ammonium fluoride.

The deposited oxide was etched in a commercial plasma hex reactor utilizing an etchant gas of $CF_4$ and $O_2$. Enough deposited oxide was removed to leave a thickness of approximately 8000 Angstroms. Windows were opened in the remaining oxide using standard photolithography and dry etching techniques. A second aluminum layer was then deposited and patterned followed by standard deposition of a capping layer.

EXAMPLE 2

Figure 6:
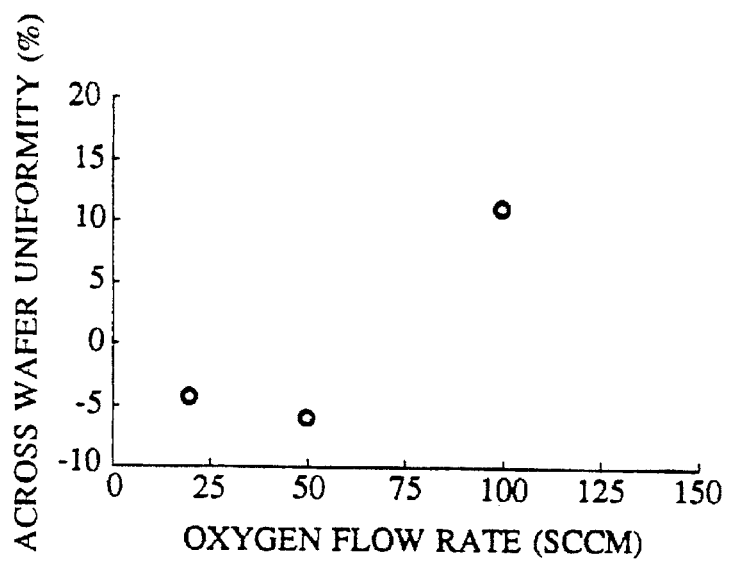
FIGS. 6 through 20 are illustrative of properties obtainable in the invention.
Figure 7:
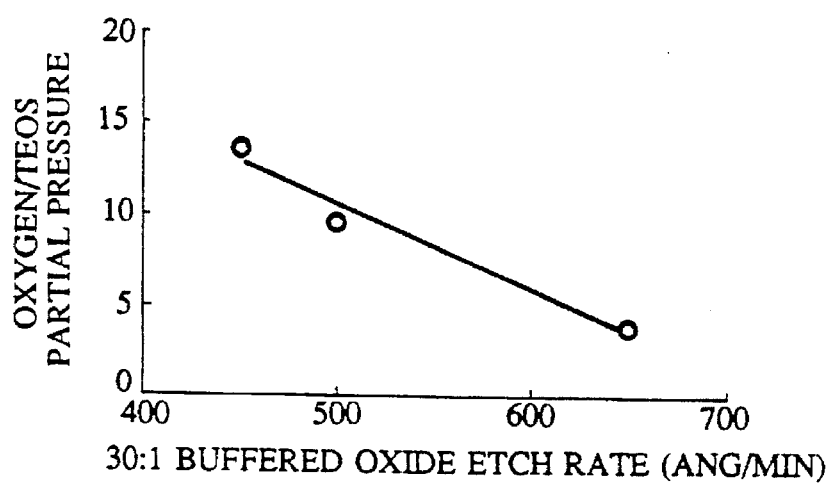

The procedure of Example 1 was followed except the molar ratio between oxygen and TEOS was varied. The graph shown in FIG. 6 indicates the variation in thickness uniformity across the wafer versus the oxygen flow rate for constant TEOS flow rate and for constant total pressure. Additionally, the etch rate versus oxygen partial pressure is shown in FIG. 7.

EXAMPLE 3

The procedure of Example 1 was followed except a variety of samples were deposited utilizing varying substrate temperatures. It was generally found that at lower temperatures the Si—O stretch decreased from 1075 towards 1040 while as the temperature increased the deposited material became more dense as evidenced by a lower etch rate. Typically, the upper temperature limit was determined by the thermal stability of the deposited metal layer. The stress of films deposited at substrate temperatures between 335 and 380 degrees Centigrade were also measured. These films had a stress that ranged between $1 \times 10^9$ dynes/cm$^2$ tensile to $1 \times 10^9$ dyres/cm$^2$ compressive.

EXAMPLE 4

Figure 8:
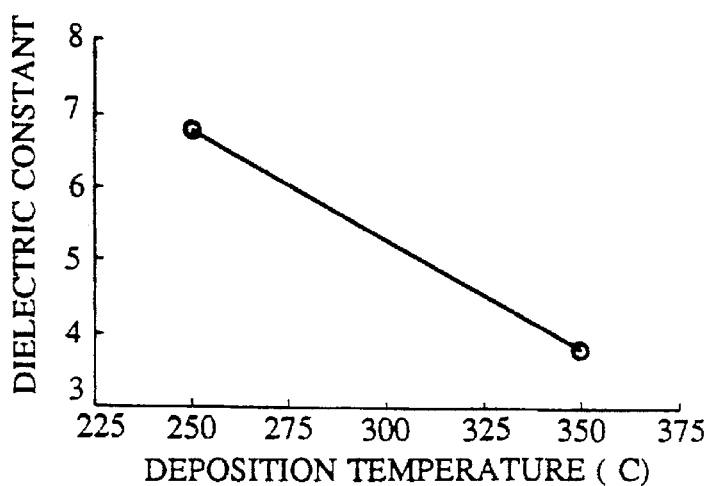

The procedure of Example 3 was followed except samples were utilized for depositions utilizing 100 kHz. The dielectric constant of the resulting film at both frequencies as a function of substrate temperature is shown in FIG. 8.

EXAMPLE 5

Figure 9:
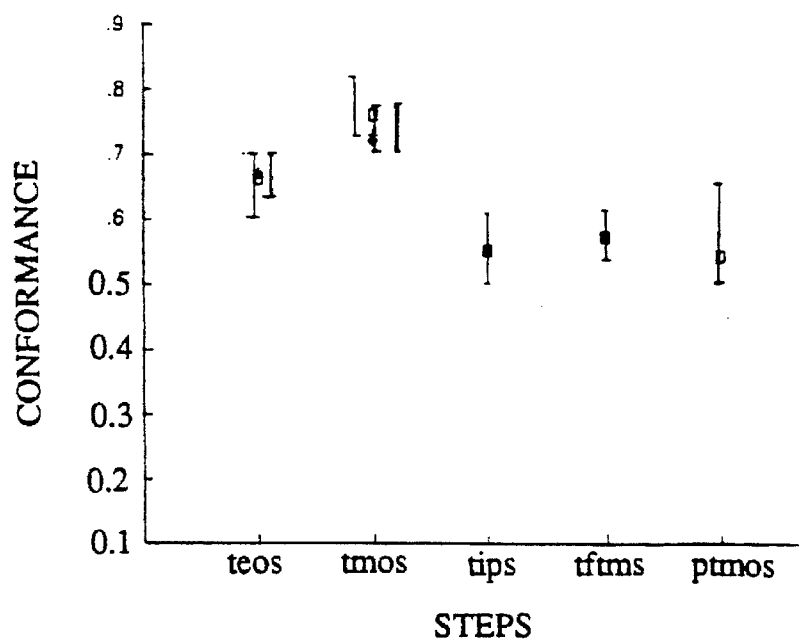

The procedure of Example 1 was followed except samples utilizing various silicon-containing compounds other than TEOS were employed. The results for these various compounds are shown in FIG. 9. It should be noted that the data indicated by squares represent the deposition at 13.5 MHz, 350 degrees Centigrade; the data indicated by crosses correspond to deposition at 100 kHz, 350 degrees Centigrade; and the data indicated by diamonds correspond to a deposition at 100 kHz, 250 degrees Centigrade. In FIG. 9 tmos means tetramethoxysilane; tips means tetraisopropoxysilane; tftms means (3,3,3-trifluoropropyl)trimethoxysilane; and ptmos means phenyltrimethoxysilane.

EXAMPLE 6

Figure 10:
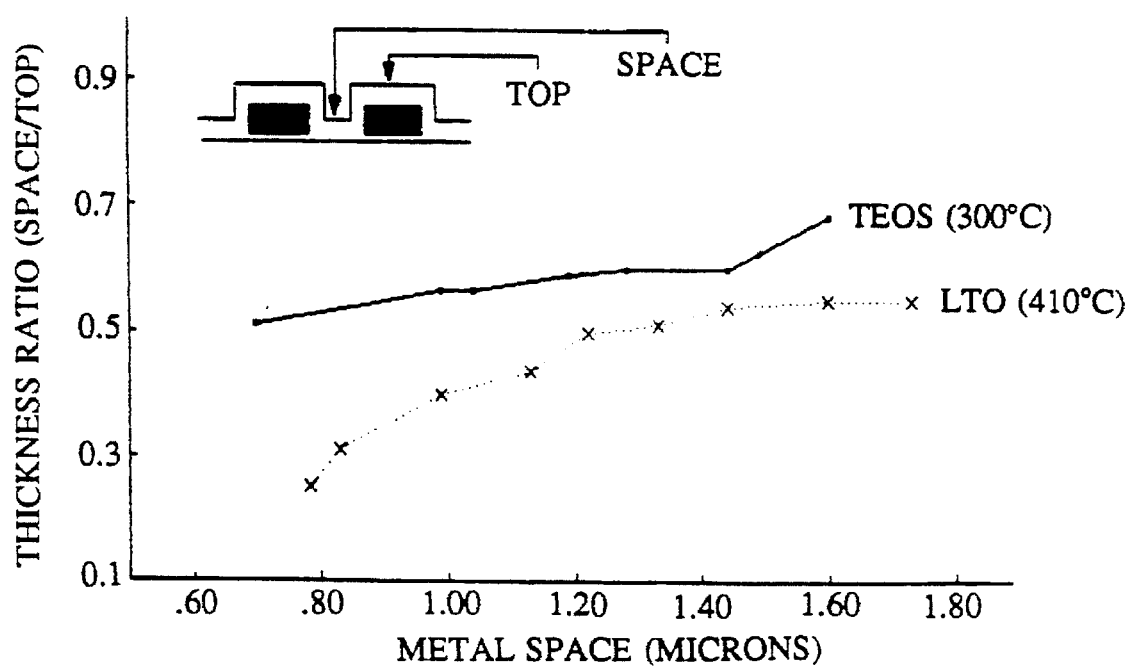

The procedure of Example 1 was followed. The results obtained were compared to the results obtained with a conventional low temperature oxide deposition process described in *VLSI Technology*, S. M. Sze, 1983, McGraw-Hill, New York, Chapter 3. This comparison for deposition onto features having various aspect ratios is shown in FIG. 10.

EXAMPLE 7

Figure 5:
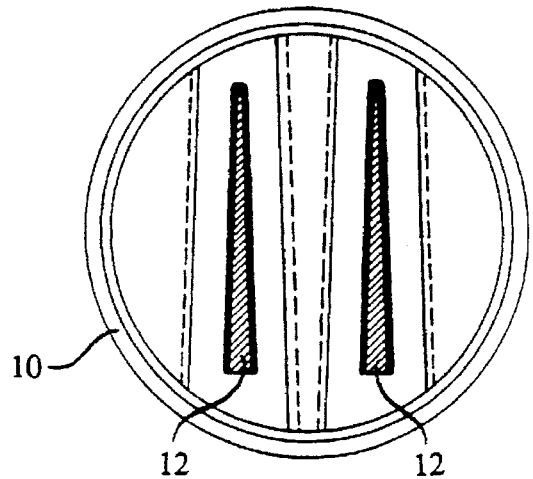

A deposition apparatus as shown in FIG. 4 was utilized. The apparatus had parallel electrodes, 12, in FIG. 5 which carried wafers on both sides. The sample electrodes had two sides with the sides forming an angle of approximately 2.5 degrees. The electrodes were approximately 24 inches long and were sufficiently long so that approximately 20 four-inch wafers could be processed at one time. The chamber was a large quartz tube, 14, that was heated utilizing a standard resistively heated furnace, 16. The equipment also had a source of phosphorus-containing compound, 18. This source included liquid trimethylphosphite with a flow controller to control the vapor from the liquid. A similar metering expedient was utilized for introducing TEOS in gas form from a liquid source, 20. The oxygen was mixed with the TEOS flow at the inlet wall to the chamber. The phosphorus source was flowed through a tube whose outlet was positioned downstream from and close to the wafers being processed. Provision was also made, 22, for introducing ammonia in combination with the TEOS and oxygen at the inlet wall of the reactor. The pressure in the chamber was measured utilizing a capacitance monomer. The pressure was controlled utilizing a throttle valve on a roughing pump. The measurements from the capacitance monomer were utilized to control the pumping speed and thus to maintain a desired pressure. An rf power source supplying radiation at a frequency of 13.5 MHz and having a matching network was employed. This radiation was supplied to the electrode which holds the samples. The other electrode was grounded.

Samples were deposited on an aluminum test pattern formed on a 4-inch silicon wafer. The test pattern included aluminum lines having a height of 1 micrometer with the width of the aluminum lines approximately 0.7 micrometers and with spaces between lines varying from 0.7 to 2.5 µm. Twenty wafers were always maintained in the deposition apparatus. However, generally, for best uniformity, 10 of these wafers were dummy wafers. The other 10 were samples to be processed and were positioned at the internal rather than periphery positions of the electrode. The samples were placed on the powered electrode, heated to 405 degrees Centigrade and the quartz tube evacuated to a pressure of approximately $10^{-5}$ Torr. Gas flows were established to yield a total pressure in the chamber of approximately 300 m Torr. To produce this total pressure, gas flows of ammonia, TEOS, and oxygen of respectively 40 sccm, 20 sccm, and 75 sccm were employed. Once the flows had equilibrated, a power of approximately 30 watts was impressed on the electrode holding the samples and plasma formation was induced. The plasma was maintained for approximately 100 minutes to yield a deposition thickness of approximately 2 µm. After the desired deposition had been achieved, the plasma was extinguished, the gas flows terminated, the chamber evacuated, and then the chamber was backfilled with dry nitrogen.

An IR spectrum of the deposited film indicated an Si—O stretch at approximately 1080 cm$^{-1}$ with no indication of water or silanol present. The stress of the deposited film was measured at approximately $2 \times 10^9$ dynes/cm tensile, the dielectric constant was approximately 5, on average for the 10 wafers the unformity was approximately 10 percent or better across the diameter. The step coverage for an aspect ratio of 1.2 was 0.89.

EXAMPLE 8

Figure 11:
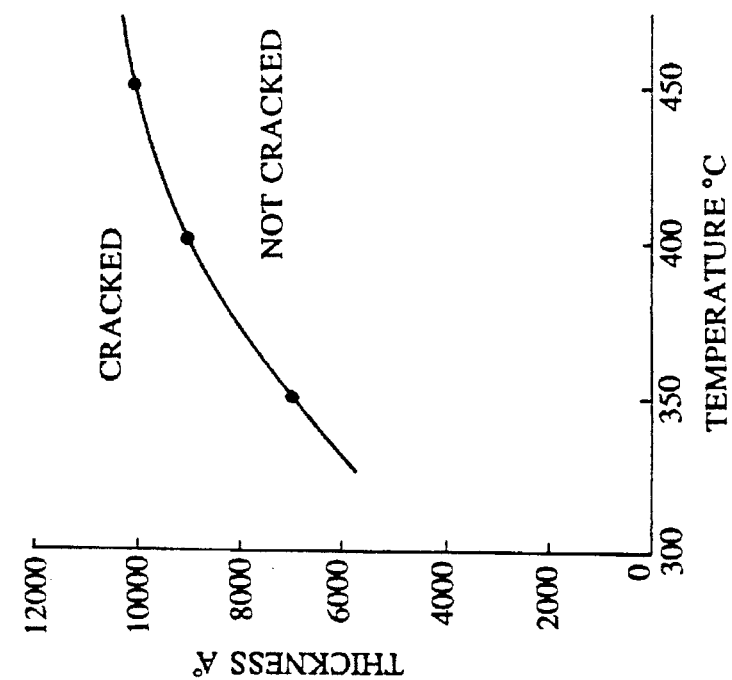

The procedure of Example 7 was followed except samples were done at varying temperatures. Temperatures between 350 degrees and 450 degrees Centigrade were employed. The stress of the resulting films as measured by cracks in the underlying silicon substrate as a function of temperature is shown in FIG. 11.

EXAMPLE 9

Figure 12:
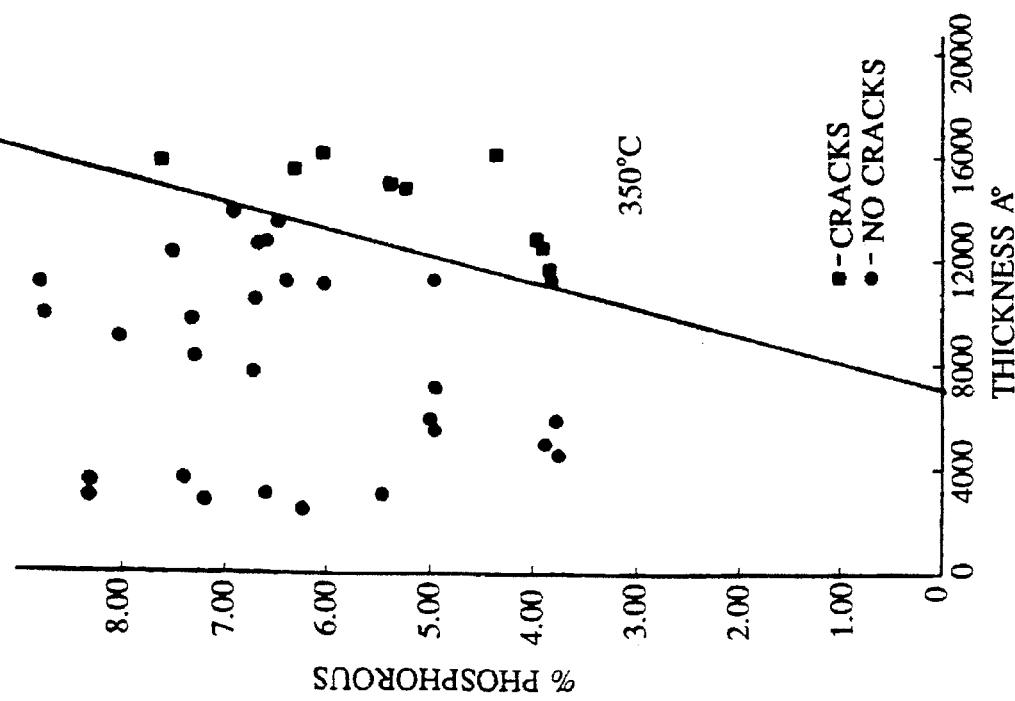
Figure 14:
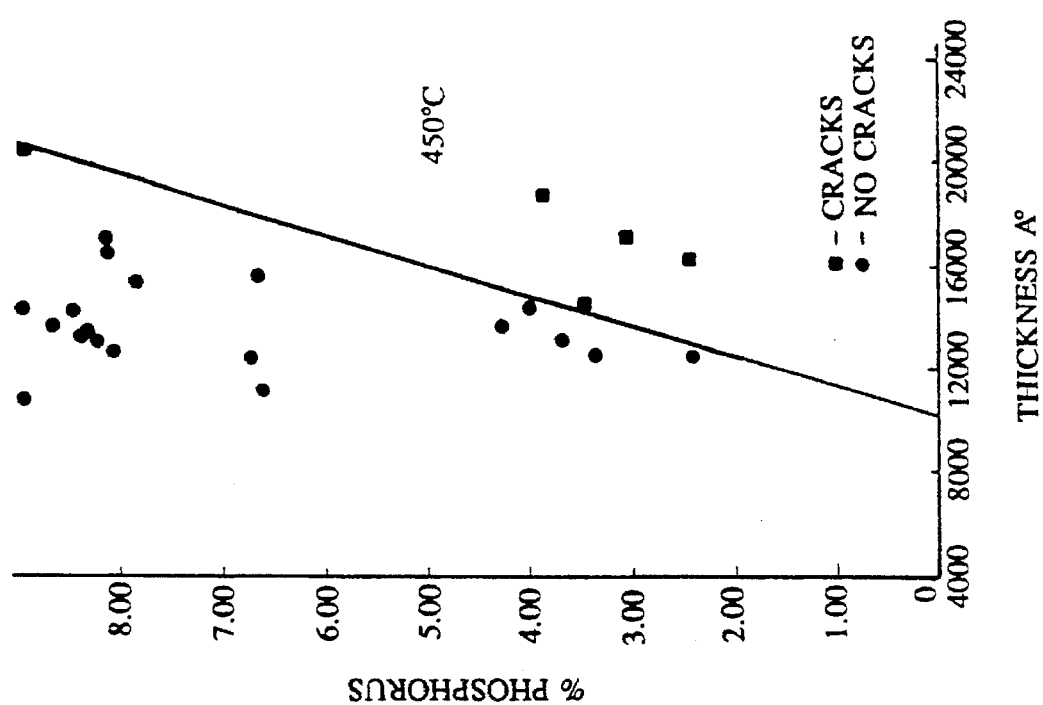
Figure 13:
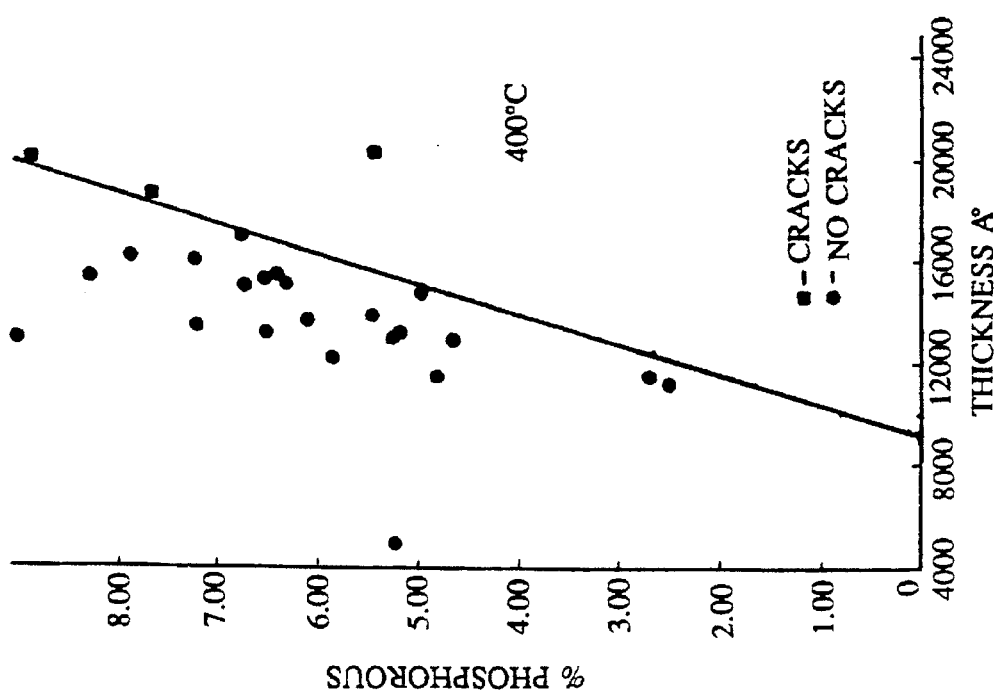

The procedure of Example 7 was followed except the flow rate of phosphorus was varied. The stress of the resulting film as measured by cracks in the silicon substrate as a function of phosphorus concentration is shown in FIGS. 12, 13, and 14.

EXAMPLE 10

Figure 15:
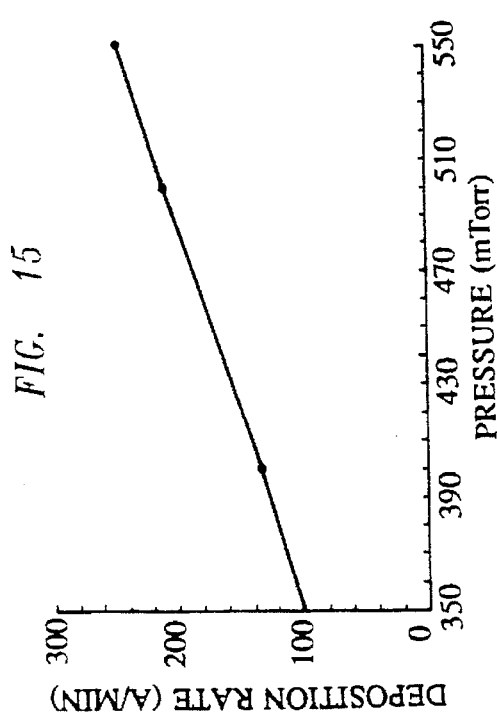
Figure 16:
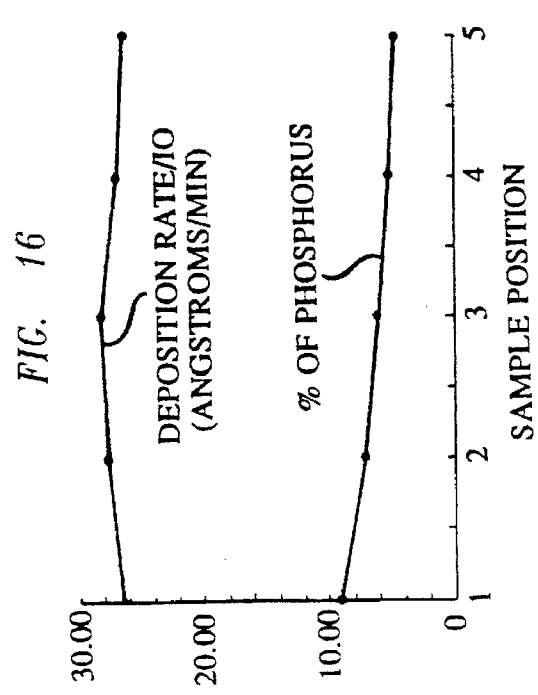

The procedure of Example 7 was followed except samples were performed at various total pressures. The resulting deposition rates versus total pressure is shown in FIG. 15. Deposition rate as a function of percent phosphorus is shown in FIG. 16.

EXAMPLE 11

Figure 17:
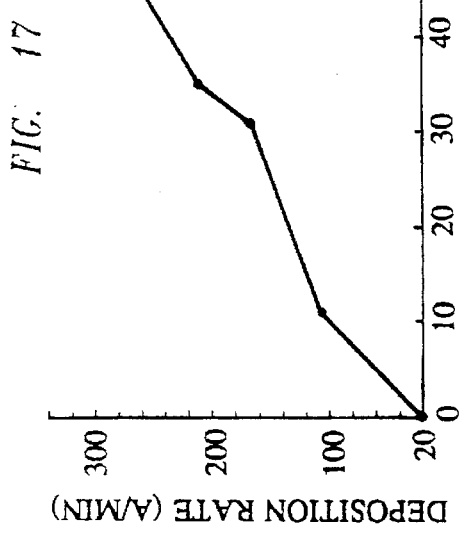

The procedure of Example 7 was followed except the amount of oxygen present in the gas flow was varied. Irrespective of the oxygen partial pressure, the total pressure was maintained at the level of Example 7. The deposition rate versus oxygen partial pressure is shown in FIG. 17.

EXAMPLE 12

Figure 18:
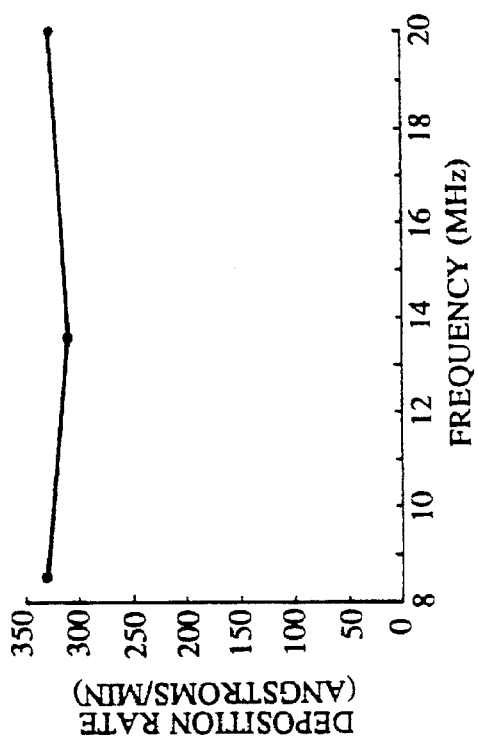
Figure 19A:
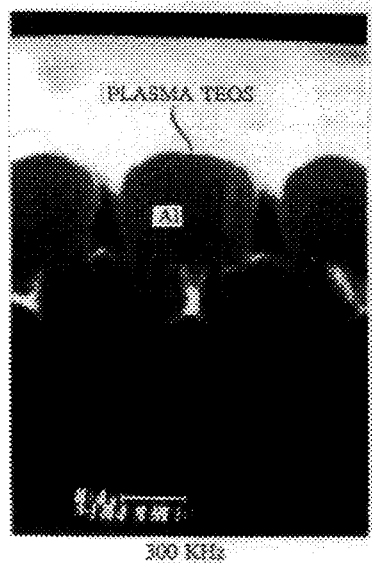
Figure 19B:
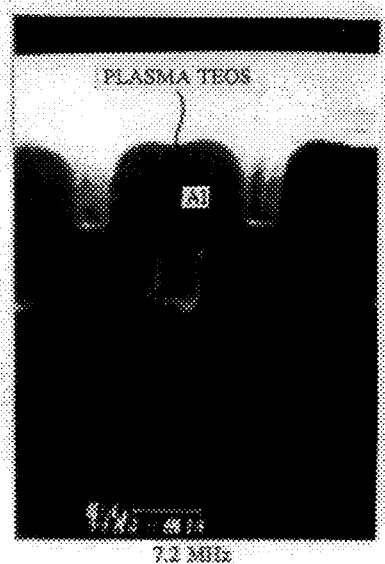
Figure 19C:
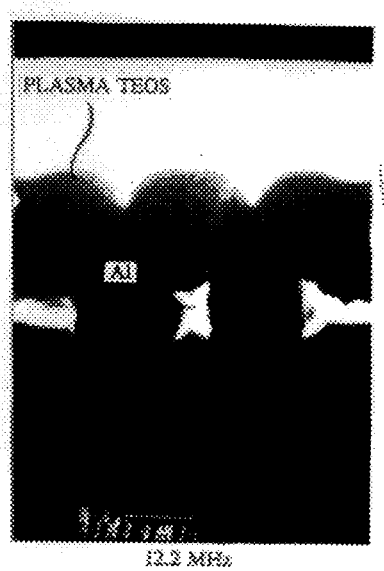
Figure 20A:
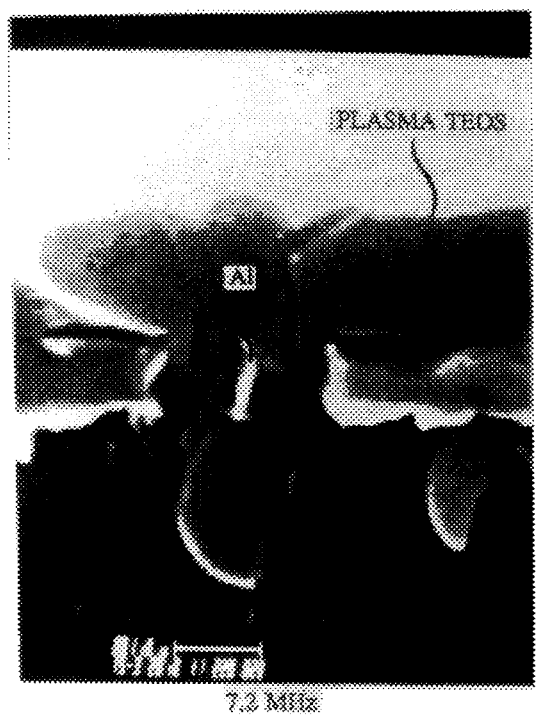
Figure 20B:
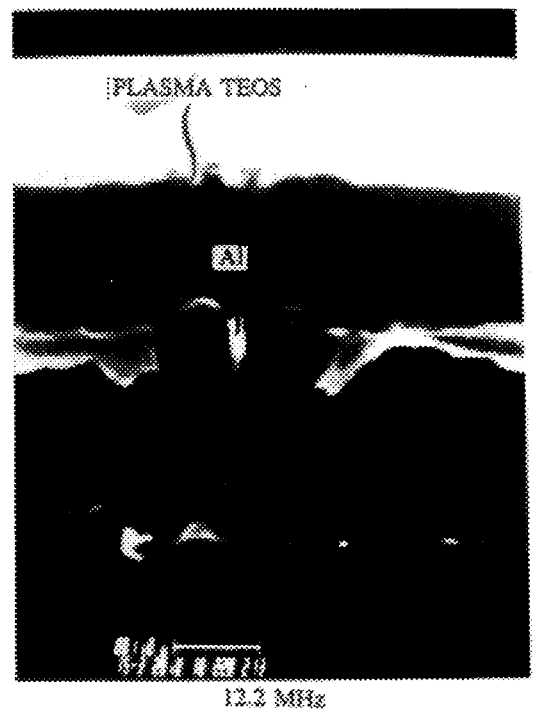

The procedure of Example 7 was followed except samples were performed at various rf frequencies. The step coverage and deposition rate as a function of frequency is shown in FIGS. 19 and 20 and FIG. 18 respectively.

What is claimed is:

1. A process for forming a device comprising the steps of 1) introducing a gaseous reaction composition to a substrate, 2) inducing a reaction in said composition to produce deposition of a silicon oxide region on said substrate, wherein said substrate at its upper surface before said deposition has a plurality of steps and 3) utilizing said oxide in completing said device, CHARACTERIZED IN THAT said silicon oxide is deposited by subjecting said substrate to a plasma in said composition wherein said composition comprises tetraethoxysilane and a source of oxygen wherein said deposited silicon oxide region is conformal to said plurality steps, wherein after said deposition a void in said silicon dioxide between said steps is substantially avoided and wherein the level of water and of silanol bonds present in said deposition is sufficiently low to substantially avoid device degradation associated with their presence.

2. The process of claim 1 wherein said device comprises a semiconductor device.

3. The process of claim 1 wherein said plasma is produced between parallel electrodes.

4. The process of claim 1 wherein said source of oxygen comprises a composition chosen from the group consisting of $O_2$, $CO_2$, $NO_2$, and $N_2O$.

5. The process of claim 4 wherein the frequency of energy employed to produce said plasma is greater than 1 MHz.

6. The process of claim 4 wherein the frequency of energy employed to produce said plasma is less than 1 MHz.

7. The process of claim 1 wherein the frequency of the energy employed to produce said plasma is above 1 MHz.

8. The process of claim 1 wherein the frequency of the energy employed to produce said plasma is less than 1 MHz.

9. The process of claim 1 wherein said tetraethoxysilane comprises relative to said source of oxygen in mole percent in the range of 25 to 50.

10. The process of claim 1 wherein the frequency of the energy employed to produce said plasma is above 1 MHz and a nitrogen-containing composition is introduced into said plasma.

11. The process of claim 10 wherein said nitrogen-containing composition comprises $NH_3$.

* * * * *